(12) United States Patent
Park et al.

(10) Patent No.: US 7,750,748 B2
(45) Date of Patent: Jul. 6, 2010

(54) METHOD AND APPARATUS FOR DISTRIBUTING CLOCK SIGNAL USING STANDING WAVES

(75) Inventors: Jongbae Park, Samcheok-si (KR); Jeonghyeon Cho, Daejeon (KR); Joungho Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 467 days.

(21) Appl. No.: 11/755,797

(22) Filed: May 31, 2007

(65) Prior Publication Data

US 2008/0008279 A1    Jan. 10, 2008

(30) Foreign Application Priority Data

Jul. 4, 2006    (KR) .................. 10-2006-0062604

(51) Int. Cl.
  *H03B 5/18*    (2006.01)
  *H03K 5/01*    (2006.01)
  *G06F 1/04*    (2006.01)

(52) U.S. Cl. .................. 331/181; 331/167; 331/74; 331/172; 331/96; 327/168; 327/295; 327/304; 713/500

(58) Field of Classification Search .................. 331/167, 331/117 R, 117 FE, 117 D, 117 DP, 74, 77, 331/181, 36 L, 172; 327/165, 167, 168, 295, 327/297, 304, 292; 713/500, 503
See application file for complete search history.

(56) References Cited

U.S. PATENT DOCUMENTS

| 5,517,532 | A | 5/1996 | Reymond |
| 6,057,724 | A | 5/2000 | Wann |
| 6,437,653 | B1 * | 8/2002 | Cruz et al. .................. 331/181 |
| 7,015,765 | B2 * | 3/2006 | Shepard et al. ......... 331/117 D |
| 7,250,826 | B2 * | 7/2007 | Gabara .................. 331/117 R |

* cited by examiner

*Primary Examiner*—Robert Pascal
*Assistant Examiner*—Ryan Johnson
(74) *Attorney, Agent, or Firm*—Daly, Crowley, Mofford & Durkee, LLP

(57) ABSTRACT

A Method and an apparatus for distributing a clock signal are disclosed. The apparatus for distributing a clock signal includes a pair of flat plates, a variable inductor and a connection channel. The pair of flat plates includes a clock flat plate having at least one of clock signal extraction points and a reference flat plate arranged in parallel to the clock flat plate. The inductor is connected between the pair of flat plates, and the connection channel is configured to connect electrically the at least one of clock signal extraction points to an external circuit. The inductor may be adjusted to have an inductance for generating a resonance signal of a target frequency from the pair of flat plates.

4 Claims, 1 Drawing Sheet

METHOD AND APPARATUS FOR DISTRIBUTING CLOCK SIGNAL USING STANDING WAVES

CROSS-REFERENCE TO RELATED APPLICATIONS

This application claims priority under 35 USC §119 to Korean Patent Application No. 10-2006-0062604, filed on Jul. 4, 2006 in the Korean Intellectual Property Office (KIPO), the disclosure of which is incorporated herein in its entirety by reference.

BACKGROUND OF THE INVENTION

1. Field of the Invention

The present invention relates to distribution of a clock signal, and more particularly to a method and an apparatus for distributing a clock signal using standing waves.

2. Description of the Related Art

It is an important subject to synchronize operations and/or data transmissions in a digital system. In general, synchronization can be achieved and maintained by a clock signal. The clock signal may be supplied at unsynchronized time to circuits located at different positions. Such a time discrepancy of the clock signal is referred to as a "skew". The skew has a bad effect on a digital system in the point of performance especially when the digital system operates at high speed. Therefore it is important that the clock signal is distributed uniformly to a whole system.

According to conventional methods, a clock distribution matrix is typically used for distributing a clock signal. In addition methods using standing waves have been proposed for distributing a clock signal to a whole system. An example of the methods is disclosed in U.S. Pat. No. 5,517,532 "Standing sine wave clock bus for clock distribution systems". These conventional methods, however, can supply a clock signal only at limited positions.

U.S. Pat. No. 6,057,724 discloses a method such that, after generating a resonance signal in whole resonance plates having two resonance plates arranged in parallel, a clock signal is supplied without phase difference by extracting the clock signal from the upper resonance plate.

However, the U.S. Pat. No. 6,057,724 has a problem that only a fixed signal can be supplied since the resonance frequency of the resonance plates is fixed. Moreover, applying the method is strictly limited since a size of the resonance plates and a wave length of the clock signal are closely related. A wave length of the resonance signal is twice of the length of the resonance plate, and speed of light in a silicon semi-conductor is approximately a half of the speed in vacuum. For example, according to the U.S. Pat. No. 6,057,724, a silicon chip having a resonance plate, the length and width of which are 3.75 cm (centimeter), can supply only a clock signal of 2 GHz. There is a tendency that clock frequency is increased, but there is another tendency that size of chips is decreased and the clocks of various frequencies are needed according to operational mode. Therefore a clock distribution method capable of controlling the frequency of clock regardless of size of a resonance plate is required.

SUMMARY OF THE INVENTION

Accordingly, the present invention is provided to substantially obviate one or more problems due to limitations and disadvantages of the related art.

Some example embodiments of the present invention provide an apparatus and a method for distributing a clock signal capable of supplying a uniform clock signal to a whole system almost without a skew.

In some embodiments of the present invention, an apparatus for distributing a clock signal includes a pair of flat plates including a clock flat plate having at least one of clock signal extraction points and a reference flat plate that is arranged in parallel to the clock flat plate, a variable inductor connected between the pair of flat plates and configured to be adjusted to have an inductance determined by a formula $$L = \frac{1}{(2\pi f)^2 \cdot C}$$

(f is a target frequency, and C is a capacitance of the pair of flat plates) for generating a resonance signal of the target frequency from the pair of flat plates, and a connection channel configured to connect electrically the at least one of clock signal extraction points to an external circuit.

The apparatus for distributing the clock signal may further include an input unit configured to supply an input signal of the target frequency to the pair of flat plates for generating the resonance signal. The variable inductor may be set up inside or outside a chip in which the pair of flat plates is formed.

In some embodiments of the present invention, a method for distributing a clock signal includes generating a resonance signal of a target frequency determined by a formula $$f = \frac{1}{2 \cdot \pi \cdot \sqrt{L \cdot C}}$$

(f is the target frequency, C is a capacitance of a pair of flat plates, and L is an inductance of a variable inductor) by connecting the variable inductor between the pair of flat plates, the pair of flat plates including a clock flat plate having at least one of clock signal extraction points and a reference flat plate arranged in parallel to the clock flat plate, and electrically connecting the at least one of clock signal extraction points to an external circuit.

In further embodiments, the method for distributing clock signal may include supplying an input signal of the target frequency to the pair of flat plates for generating the resonance signal.

Therefore, the apparatus according to an example embodiment of the present invention supply a uniform clock signal to a whole system almost without skew.

DESCRIPTION OF THE EMBODIMENTS

Figure 1:
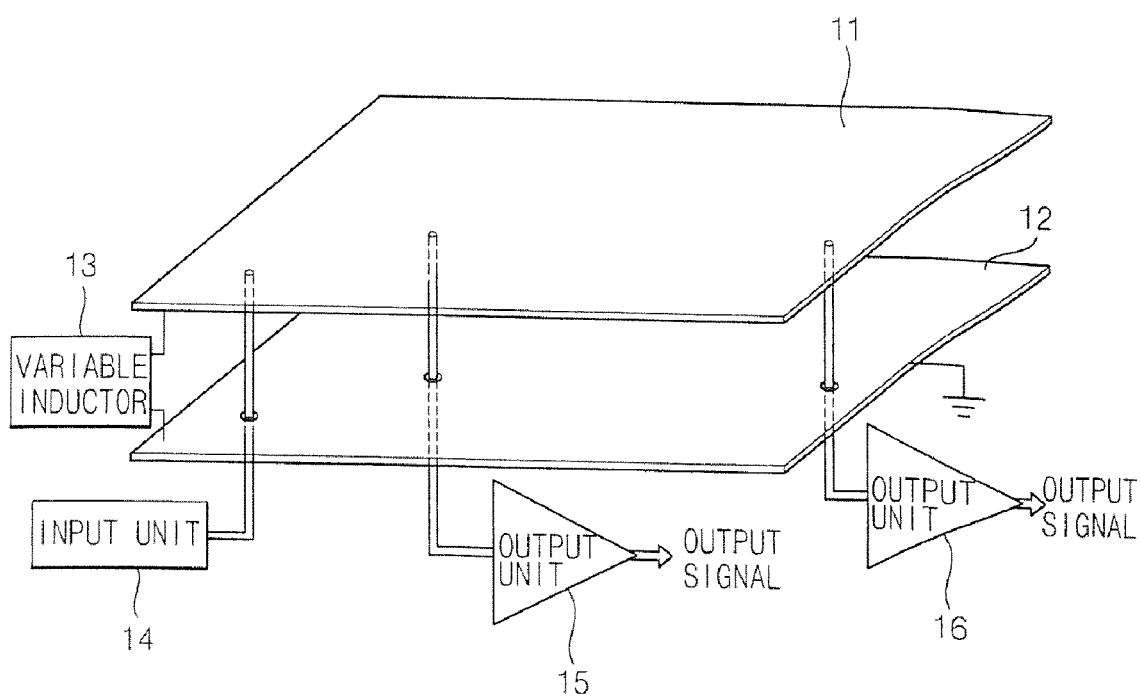
FIG. 1 is a diagram illustrating an apparatus for distributing a clock signal according to some embodiments of the invention.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating an apparatus for distributing a clock signal according to some embodiments of the invention.

Referring to FIG. 1, an apparatus 10 for distributing a clock signal includes a pair of flat plates 11 and 12 that are arranged in parallel to each other, a variable inductor 13 connected between the pair of flat plates, an input unit 14 supplying an input signal to a clock flat plate 11 for generating an electrical resonance in the pair of flat plates 11 and 12, and output units 15 and 16 supplying a resonance signal extracted from predetermined positions of the clock flat plate 11 to an exterior through 'via'. The pair of flat plates 11 and 12 may form a conductor, and the input signal may be a sinusoidal wave of a single frequency.

First of all, it is assumed that the variable inductor 13 is not included. The pair of flat plates has a self-capacitance and a self-inductance determined by its own structure. Consequently if the input signal of a resonance frequency determined by the capacitance and the inductance is supplied to the pair of flat plates 11 and 12, then the resonance signal appears in the clock flat plate 11. However, since the self-inductance is very small, the frequency of the resonance signal is very high.

In case that the variable inductor is connected at a corner between the pair of flat plates 11 and 12, the inductance of the pair of flat plates 11 and 12 is determined substantially by the variable inductor 13.

If the inductance of the variable inductor is L, and the capacitance of the pair of flat plates 11 and 12 is C, then the frequency f of the resonance signal generated between the pair of flat plates 11 and 12 can be approximately expressed by the formula 1 as follows:

$$f = \frac{1}{2 \cdot \pi \cdot \sqrt{L \cdot C}} \qquad \text{[Formula 1]}$$

The resonance signal of a target frequency ranging from tens of MHz to a few GHz can be generated by adjusting the inductance. The Inductance L is given by the formula 2 as follows:

$$L = \frac{1}{(2\pi f)^2 \cdot C} \qquad \text{[Formula 2]}$$

Figure 2:
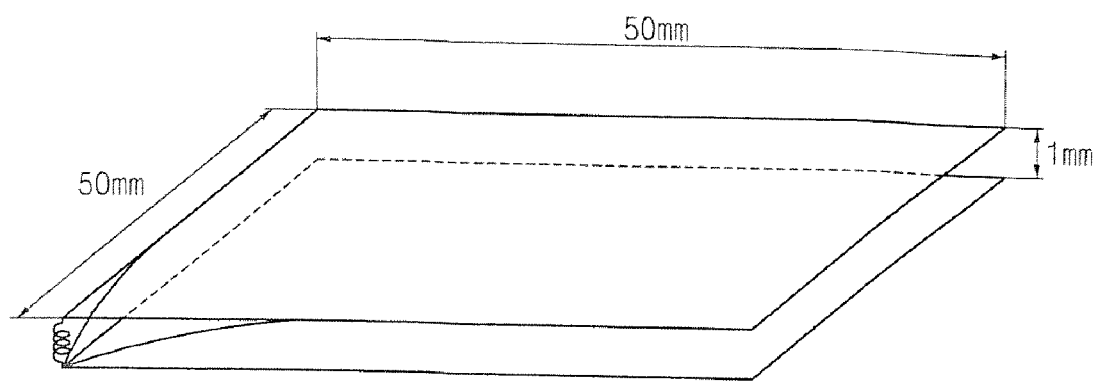
FIG. 2 is a three-dimensional graph illustrating distribution of intensity of electric field when the apparatus for distributing the clock signal of FIG. 1 is in resonance.

FIG. 2 is a three dimensional graph illustrating distribution of intensity of electric field when the apparatus for distributing the clock signal of FIG. 1 is in resonance.

Referring to FIG. 2, each length and width of two flat plates is 50 mm, the two flat plates are separated from each other by 1 mm, and an inductor has an inductance of 1 nH. Intensities of electric field between the flat plates are almost uniformly distributed except at a near corner to which the inductor is connected. Therefore, a resonance signal having almost same waveform can be extracted from an arbitrary position in most of region except at the near corner.

Referring back to FIG. 1, the resonance signal is extracted from an arbitrary position of the clock flat plate 11 through a connection channel, for example, a 'via'. Here, the via may be configured to pass through a reference flat plate, so that the via has the smallest size and does not affect the resonance frequency. Signals extracted from the via are outputted through the output units 15 and 16 and are supplied to circuits as a clock signal. Output signals which are outputted through the several output units 15 and 16 have almost same phase and there is almost no skew. Resonance energy is decreased as the output signals are supplied to the outside, and the decreased energy can be supplemented by the input unit 14. Therefore, the apparatus 10 for distributing the clock signal can maintain uniform output signals as long as the resonance is maintained.

In some embodiments, the apparatus for distributing the clock signal may have a variable inductor set up inside a chip, or outside a chip. The variable inductor may be implemented with a variable inductance tuning device.

As mentioned above, the apparatus and the method for distributing a clock signal according to example embodiments of the present invention can supply a uniform clock signal to a whole system almost without skew. By adjusting an inductance, a resonance signal of a target frequency ranging from tens of MHz to a few GHz can be generated.

While the example embodiments of the present invention and their advantages have been described in detail, it should be understood that various changes, substitutions and alterations may be made herein without departing from the scope of the invention.

What is claimed is:

1. An apparatus for distributing a clock signal, comprising:
   a pair of flat plates including a clock flat plate having at least one of clock signal extraction points and a reference flat plate arranged in parallel to the clock flat plate;
   a variable inductor connected between the pair of flat plates and configured to be adjusted to have an inductance determined by a formula $$L = \frac{1}{(2\pi f)^2 \cdot C},$$

where f is a target frequency and C is a capacitance of the pair of flat plates, for generating a resonance signal of the target frequency from the pair of flat plates;
   a connection channel configured to connect electrically the at least one of clock signal extraction points to an external circuit; and
   an input unit configured to supply an input signal of the target frequency to the pair of flat plates for generating the resonance signal.

2. The apparatus of claim 1, wherein the variable inductor is set up inside a chip in which the pair of flat plates is formed.

3. The apparatus of claim 1, wherein the variable inductor is set up outside a chip in which the pair of flat plates is formed.

4. A method for distributing a clock signal, comprising:
   generating a resonance signal of a target frequency determined by a formula $$f = \frac{1}{2 \cdot \pi \cdot \sqrt{L \cdot C}},$$

where f is the target frequency, C is a capacitance of a pair of flat plates, and L is an inductance of a variable inductor, by connecting the variable inductor between the pair of flat plates, the pair of flat plates including a clock flat plate having at least one of clock signal extraction points and a reference flat plate arranged in parallel to the clock flat plate;
   electrically connecting the at least one of clock signal extraction points to an external circuit; and
   supplying an input signal of the target frequency to the pair of flat plates for generating the resonance signal.

* * * * *